United States Patent
Zhang et al.

(10) Patent No.: US 12,031,410 B2
(45) Date of Patent: Jul. 9, 2024

(54) WELL DRILLING TOOL AND METHOD FOR DETERMINING PARAMETER THEREOF

(71) Applicants: CHINA PETROLEUM & CHEMICAL CORPORATION, Beijing (CN); SINOPEC PETROLEUM ENGINEERING TECHNOLOGY RESEARCH INSTITUTE CO., LTD, Beijing (CN)

(72) Inventors: Haiping Zhang, Beijing (CN); Yanbin Zang, Beijing (CN); Guangjun Ma, Beijing (CN); Jiachang Wang, Beijing (CN); Mingguang Sun, Beijing (CN); Xinghua Tao, Beijing (CN); Lingchao Xuan, Beijing (CN); Xiaodan Liu, Beijing (CN); Renlong Zhang, Beijing (CN)

(73) Assignees: China Petroleum & Chemical Corporation, Beijing (CN); Sinopec Petroleum Engineering Technology Research Institute Co., Ltd., Beijing (CN)

( * ) Notice: Subject to any disclaimer, the term of this patent is extended or adjusted under 35 U.S.C. 154(b) by 163 days.

(21) Appl. No.: 17/757,053

(22) PCT Filed: Sep. 11, 2020

(86) PCT No.: PCT/CN2020/114857
§ 371 (c)(1),
(2) Date: Jun. 8, 2022

(87) PCT Pub. No.: WO2021/120720
PCT Pub. Date: Jun. 24, 2021

(65) Prior Publication Data
US 2023/0020998 A1 Jan. 19, 2023

(30) Foreign Application Priority Data
Dec. 16, 2019 (CN) .......................... 201911295614.6

(51) Int. Cl.
*E21B 4/16* (2006.01)
*E21B 4/06* (2006.01)
(Continued)

(52) U.S. Cl.
CPC .................. *E21B 4/16* (2013.01); *E21B 4/06* (2013.01); *E21B 4/10* (2013.01); *G06F 30/17* (2020.01)

(58) Field of Classification Search
CPC ..... E21B 1/12; E21B 1/14; E21B 1/16; E21B 1/38; E21B 6/00; E21B 6/02; E21B 4/10; E21B 4/16
See application file for complete search history.

(56) References Cited

U.S. PATENT DOCUMENTS

| 4,958,691 A | 9/1990 | Hipp |
| 7,882,906 B1 | 2/2011 | Decuir, Sr. |

(Continued)

FOREIGN PATENT DOCUMENTS

| CN | 203201472 U | 9/2013 |
| CN | 105239929 A | 1/2016 |

(Continued)

*Primary Examiner* — Robert E Fuller
(74) *Attorney, Agent, or Firm* — Nkl Law; Allen Xue (57) ABSTRACT

A drilling tool has an upstream drilling string, a downstream drilling bit, and a percussive device connected between the upstream drilling string and the downstream drilling bit. In a first state, the upstream drilling string is generated with elastic compression by the percussive device, and in a second state, the upstream drilling string releases the elastic compression to apply impacts on the downstream drilling bit through the percussive device. The drilling tool has a prolonged service life and can effectively reduce the drilling cost.

14 Claims, 7 Drawing Sheets

(51) Int. Cl.
E21B 4/10 (2006.01)
*G06F 30/17* (2020.01)

(56) References Cited

U.S. PATENT DOCUMENTS

2004/0222021 A1   11/2004  Trevas
2011/0031020 A1*   2/2011  Cote ........................ E21B 4/14
                                                                                     175/57

FOREIGN PATENT DOCUMENTS

| | | | |
|---|---|---|---|
| CN | 105275384 | A | 1/2016 |
| CN | 105525868 | A | 4/2016 |
| CN | 105672873 | A | 6/2016 |
| CN | 106545304 | A | 3/2017 |
| CN | 108798532 | A | 11/2018 |
| CN | 109681114 | A | 4/2019 |
| CN | 109695423 | A | 4/2019 |
| CN | 208734274 | U * | 4/2019 |
| CN | 208734274 | U | 4/2019 |
| CN | 110410000 | A | 11/2019 |
| RU | 44141 | U1 | 2/2005 |
| RU | 2351729 | C2 | 4/2009 |
| RU | 2705698 | C2 | 11/2019 |
| SU | 927947 | A1 | 5/1982 |
| SU | 1126680 | A1 | 11/1984 |
| SU | 1670075 | A1 | 8/1991 |
| WO | 2012120403 | A1 | 9/2012 |
| WO | 2016149795 | A1 | 9/2016 |

\* cited by examiner

WELL DRILLING TOOL AND METHOD FOR DETERMINING PARAMETER THEREOF

CROSS-REFERENCE TO RELATED APPLICATIONS

This application is a U.S. national stage entry of PCT International Application No. PCT/CN2020/114857, filed on Sep. 11, 2020, which claims the priority of Chinese patent application No. 201911295614.6, entitled "Well Drilling Tool and Method for Determining Parameter thereof" and filed on Dec. 16, 2019, the entire content of which is incorporated herein by reference.

TECHNICAL FIELD

The present invention relates to the technical field of well drilling, in particular to a drilling tool. The invention also relates to a method for determining parameters of the drilling tool. The drilling tool can be used for drilling speed enhancement in oil and gas exploration and exploitation, and in mines, quarries, geological investigations, water wells, geothermal fields, or the like as well.

TECHNICAL BACKGROUND

With the developments of land deep/ultra-deep well drilling, deep-water offshore drilling, shale oil/gas exploitation and hot-dry rock geothermal resource exploitation, the fields of energy development and scientific drilling are constantly broadened. The formations encountered in drilling operations are more ancient with poor rock drillability, causing rather low drilling efficiency. This will directly result in gradually increasing drilling costs, so that there is an increasingly strong demand for speed enhancement in drilling. Rotary percussion drilling technology is one of the effective methods for rapid drilling, wherein various percussion drilling tools are adopted to drive a hammer through drilling fluid to generate a high-frequency percussive load, so that the rock will suffer volumetric fracture, thereby improving rock-breaking efficiency. This type of technology has been developed rapidly since its birth.

In recent years, China has carried out extensive researches on various drilling technologies, and has made breakthroughs in some fields. Especially, in the percussion drilling field, a variety of percussion drilling tools has been developed, which indicates an initial good prospect for speed enhancement. However, these tools are generally immature. The lifespan of percussion drilling tools in oil drilling applications has always been a bottleneck restricting the development of this technology.

Therefore, there is a need for a drilling tool that can improve the speed-enhancing mechanism of conventional percussion drilling tools as described above.

SUMMARY OF THE INVENTION

In view of some or all of the above problems, the present invention proposes a drilling tool. The present invention also proposes a method for determining parameters of the drilling tool. This drilling tool improves the speed-enhancing mechanism of conventional percussion drilling tools by combining the principles of rotary percussion drilling and elastic energy storage, thus achieving a major breakthrough in drilling technology. Especially, when applied to difficult-to-drill formations in the lower part of deep/ultra-deep wells, the drilling tool has significant speed-enhancing and efficiency-improving effects, indicating excellent application prospect. Moreover, the drilling tool is durable and has a long service life.

According to a first aspect of the present invention, a drilling tool is proposed, comprising an upstream drilling string, a downstream drilling bit, and a percussive device connected between the upstream drilling string and the downstream drilling bit. In a first state, the upstream drilling string is generated with elastic compression by the percussive device, and in a second state, the upstream drilling string releases the elastic compression to apply impacts on the downstream drilling bit through the percussive device.

Under the action of the percussive device, the upstream drilling string can be elastically compressed. The elastic compression of the upstream drilling string, when released, provides impacts for the percussive device. The impacts are transmitted to the downstream drilling bit, so that the downstream drilling bit can impact the formation. As a result, the drilling bit can impact the formation in rotary drilling, thus breaking the formation more easily. With this arrangement, it is more beneficial to improve the drilling efficiency and reduce the drilling cost.

In one embodiment, the percussive device comprises: a rotary driving part configured to be rotatable about its axis; a rotary working part, which has an upper end in engagement with a lower end of the rotary driving part and a lower end connected with the downstream drilling bit, wherein the rotary working part is configured to be driven by the rotary driving part to rotate about its axis, and axially movable relative to the rotary driving part; and a percussion generating part arranged around the rotary working part, the percussion generating part having an upper end abutting against the upstream drilling string and a lower end abutting against the rotary working part. In the first state, the percussion generating part moves upstream so that the upstream drilling string is generated with the elastic compression, and in the second state, the upstream drilling string releases the elastic compression, so that the percussion generating part moves downstream to apply impact on the rotary working part.

In one embodiment, the rotary driving part comprises a cylindrical driving rod, which has an upper end coupled with a power source. The rotary working part comprises a cylindrical rotary rod, which has an upper end in engagement with a lower end of the driving rod through a driving key, and a lower end connected with the downstream drilling bit. The upper end of the rotary rod is inserted into the lower end of the driving rod and provided at an outer side thereof with the driving key extending along an axial direction of the rotary rod, and the lower end of the driving rod is provided at an inner side thereof with a driving slot extending along an axial direction of the driving rod, wherein the driving key is fitted in the driving slot, so that the rotary rod is fixed relative to the driving rod along a circumferential direction, and movable relative thereto along the axial direction.

In one embodiment, the percussion generating part comprises a percussive sleeve, which is arranged around the rotary rod, and has a first sleeve segment with a relatively small inner diameter and a second sleeve segment with a relatively large inner diameter, the second sleeve segment being arranged below and connected with the first sleeve segment, wherein an upper driven tooth is formed at an inner side of the percussive sleeve in an area connecting the first sleeve segment with the second sleeve segment. The rotary rod includes a first rotating segment with a relatively small outer diameter and a second rotating segment with a relatively large outer diameter, the second rotating segment being arranged below and connected with the first rotating segment, wherein a lower driving tooth is formed on an outer side of the rotary rod in an area connecting the first rotating segment with the second rotating segment. The lower driving tooth and the upper driven tooth are configured to be in cooperation with each other, so that when the rotary rod rotates relative to the percussive sleeve, the percussive sleeve reciprocates axially relative to the rotary rod under the cooperation between the lower driving tooth and the upper driven tooth.

In one embodiment, the upper driven tooth and the lower driving tooth are each configured with an upward tooth segment inclined upstream in a direction opposite to a rotating direction, and a downward tooth segment inclined downstream in the direction opposite to the rotating direction, wherein an inclination of the upward tooth segment is smaller than that of the downward tooth segment.

In one embodiment, the rotary rod further comprises a third rotating segment, which is connected to a lower end of the second rotating segment and has an outer diameter larger than that of the second rotating segment, and a percussive step facing upstream is formed between the second rotating segment and the third rotating segment, so that the lower end of the percussive sleeve is opposite to and able to impact on the percussive step. An axial gap is formed between the upper driven tooth and the lower driving tooth when the lower end of the percussive sleeve is in contact with the percussive step.

In one embodiment, a cylindrical outer shell is arranged around the percussive sleeve, the outer shell being slidably engaged with the percussive sleeve through an orienting key, and having an upper end connected with the upstream drilling string. The percussive sleeve is provided at an outer side thereof with the orienting key extending axially, and the outer shell is provided at an inner side thereof with an orienting slot extending axially, the orienting key being fitted in the orienting slot so that the percussive sleeve is fixed relative to the outer shell in the circumferential direction, and movable relative thereto in the axial direction.

In one embodiment, the outer shell includes an upper shell portion connected to the upstream drilling string, and a lower shell portion located below and connected with the upper shell portion, at least a part of the driving rod being disposed within the upper shell portion, wherein a swivel bearing is provided between the upper shell portion and the driving rod to allow rotation of the driving rod relative to the upper shell portion. The lower shell portion surrounds the percussive sleeve. A lower end of the upper shell portion is inserted into an upper end of the lower shell portion, and a supporting sleeve is provided between the lower end of the upper shell portion and the upper end of the percussive sleeve, so that the percussive sleeve exerts a force on the upper shell portion through the supporting sleeve, thereby elastically compressing the upstream drilling string.

In one embodiment, the third rotating segment of the rotary rod is formed on a side wall thereof with a groove, in which a limiting block protruding radially outward relative to the third rotating segment is arranged. A cylindrical outer shell is arranged around the percussive sleeve and extends downward to surround the third rotating segment, and has an engaging portion extending radially inwardly at a lower end of the outer shell, wherein the limiting block is located upstream of the engaging portion, and configured to be able to abut against the engaging portion to restrict a downstream movement of the rotary rod relative to the outer shell.

According to a second aspect of the present invention, a method for determining parameters of the above drilling tool is proposed, wherein the upstream drilling string including a drill pipe and a drill collar located below and connected with the drill pipe. The method includes steps of: determining a value of a minimum percussive power required for drilling based on a compressive strength of rock of a formation to be drilled; determining a value of a preset percussive power based on the determined value of the minimum percussive power, wherein the value of the preset percussive power is not lower than that of the minimum percussive power; determining a minimum WOB required for drilling based on the value of the preset percussive power, and determining a torque value required for operations of the power source and the driving rod based on the minimum WOB required for drilling, and then determining a type of the power source and parameters of the driving rod, and then selecting and determining drilling parameters as required based on power source manual, wherein the drilling parameters include WOB, displacement or rotational speed, and/or determining structural parameters of the rotary rod and the percussive sleeve of the drilling tool based on the minimum WOB required for drilling, wherein the structural parameters include tooth number and tooth height of each of the lower driving tooth and the upper driven tooth.

Compared with the prior arts, the present invention has the advantages as follows. The drilling tool of the present application combines the principles of rotary percussion drilling and elastic energy storage, which improves the speed-enhancing mechanism of conventional percussion drilling tools, so that the drilling tool can impact the formation at a high frequency and a high stroke, thereby achieving easy formation-breaking. This can effectively improve drilling efficiency and reduce drilling cost. Moreover, when the drilling tool is applied to difficult-to-drill formations in the lower part of deep/ultra-deep wells, the effect of speed-enhancement and efficiency-enhancement is more significant.

BRIEF DESCRIPTION OF THE DRAWINGS

In the following the present invention will be explained in more detail by way of illustrative exemplary embodiments with reference to the accompanying drawings. In the drawings.

In the drawings, the same reference numerals are used to indicate the same components. The drawings are not drawn to actual scale.

DETAILED DESCRIPTION OF EMBODIMENTS

FIGS. 1-7 show one embodiment of a drilling tool 1 according to the present invention. The drilling tool 1 includes an upstream drilling string 10, a driving mechanism 20, a percussive device 30, and a downstream drilling bit (not shown), which are arranged in this order from top to bottom.

Figure 2:
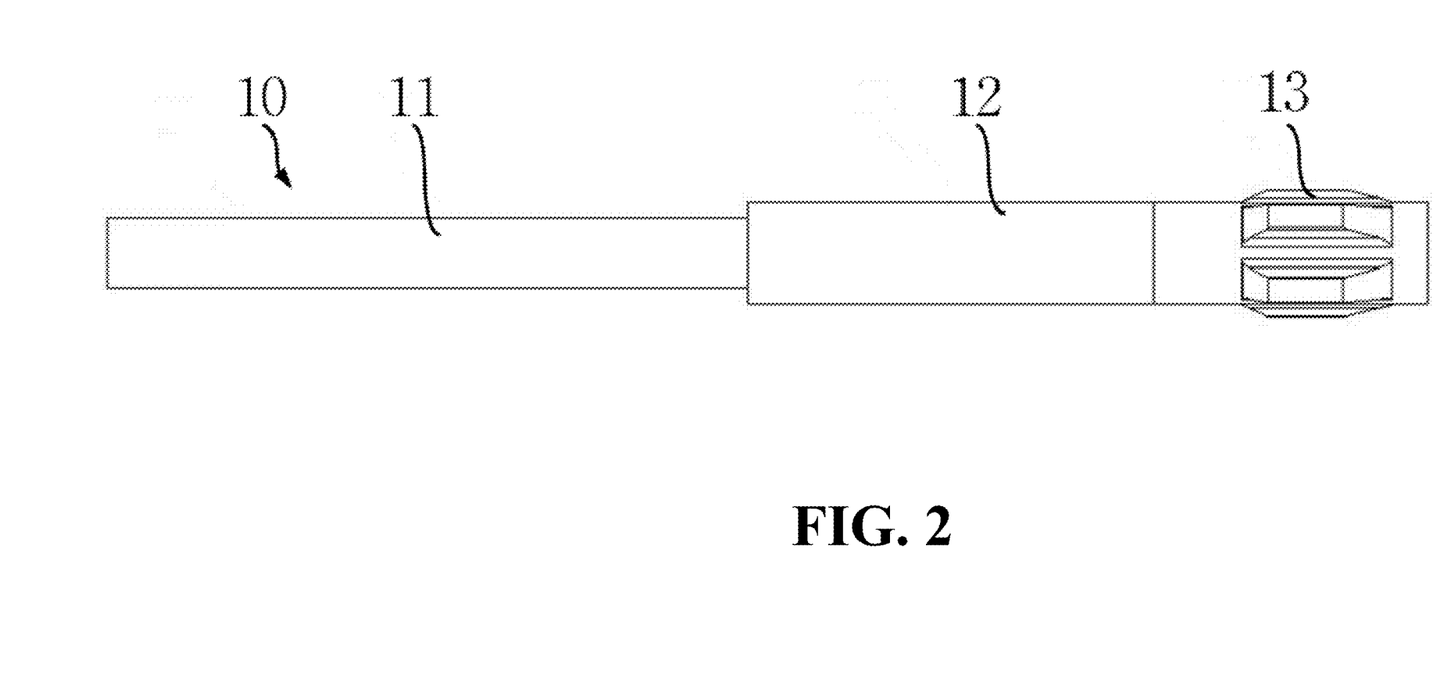
FIG. 2 shows an embodiment of an upstream drilling string of the drilling tool of FIG. 1.

As shown in FIG. 2, the upstream drilling string 10 includes a drill pipe 11, a drill collar 12 located downstream of the drill pipe 11 and connected therewith, and a stabilizer 13 located downstream of the drill collar 12 and connected therewith. The upstream drilling string 10 per se is resilient, so that when a certain compressive force is applied to the upstream drilling string 10 at a certain depth in the well, the upstream drilling string 10 will be compressed by a certain amount. This compression causes that the upstream drilling string 10 is stored with a certain amount of energy. Accordingly, the present invention proposes to utilize the energy to drive the downstream drilling bit for percussive rock-breaking, which will be described in detail below.

The driving mechanism 20 includes a cylindrical housing, and a power source enclosed in the cylindrical housing. The housing is located downstream of the stabilizer 13 and connected therewith. For example, according to the parameters (such as WOB, displacement, torque, rotational speed, or the like) required for drilling operations, the driving mechanism 20 can be one of the following: an upper assembly of a conventional screw-driving drilling tool (mud motor), which includes a bypass valve assembly, an anti-drop assembly, a motor assembly, and a universal shaft assembly; an upper assembly of a special screw-driving drilling having high-torque structural parameters, which includes a special bypass valve assembly, a special anti-drop assembly, a special motor assembly, and a special universal shaft assembly; an upper assembly of a conventional turbodrill, which includes a turbine joint with a special impeller group, a turbine universal shaft and a turbine bearing section; and an upper assembly of a special turbodrill, which includes a turbine joint with a special impeller group, a special turbine universal shaft and a special turbine bearing section. That is, the power source may be a screw motor, a turbodrill, or the like. The structures of the above-mentioned driving mechanism 20 are all known in the field, and would not be repeated here.

Figure 3:
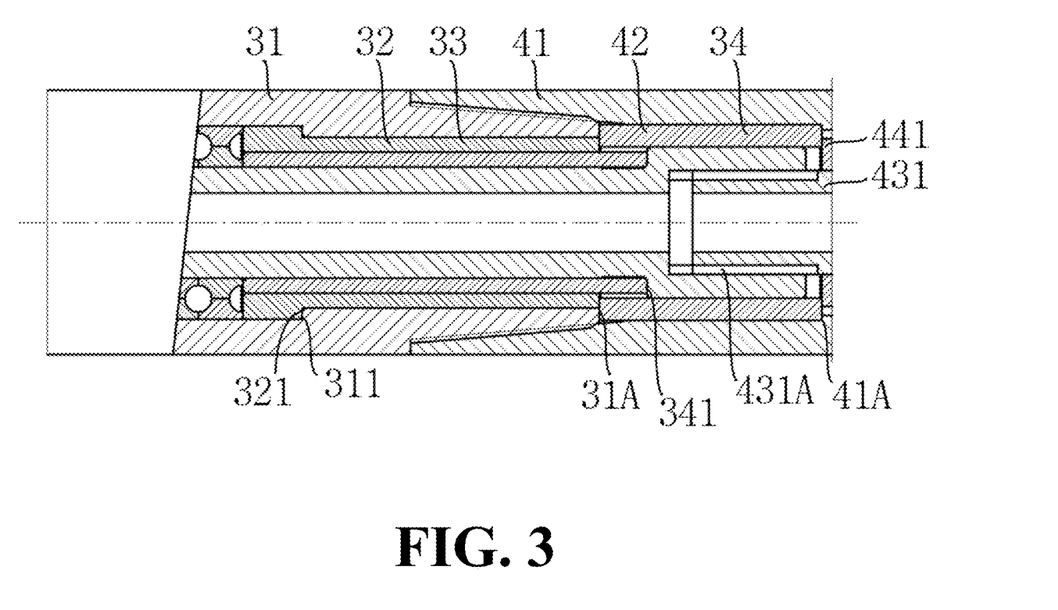
FIG. 3 schematically shows a portion of the drilling tool of FIG. 1.

The percussive device 30 includes a rotary driving part, which can be configured, for example, as a cylindrical driving rod 34 (FIG. 3). The driving rod 34 extends along an axial direction, and has an upstream end coupled with the power source, so that the driving rod can be rotated by the power source. As shown in FIG. 3, the percussive device 30 further includes an outer shell, which includes an upper shell portion 31, and a lower shell portion 41 located downstream of the upper shell portion 31 and connected therewith. An upstream end of the upper shell portion 31 is connected with the cylindrical housing of the driving mechanism 20. Since the driving mechanism 20 can have various forms, the upstream end of the upper shell portion 31 is structured to match with the screw or a bearing shell of the turbodrill. At least a part of the driving rod 34 extends into the upper shell portion 31. A swivel bearing is provided between the driving rod 34 and the upper shell portion 31, and includes a static bearing ring 32 arranged in the upper shell portion 31 by means of snap connection, and a movable bearing ring 33 that is arranged between the static bearing ring 32 and the driving rod 34 and rotatable relative to the static bearing ring 32. In this manner, the driving rod 34 can be freely rotatable relative to the upper shell portion 31. A downstream end of the driving rod 34 extends into said lower shell portion 41.

Specifically, an upper end of the static bearing ring 32 abuts against the screw, or an outer ring of the turbine bearing pack (since the driving mechanism 20 per se includes a bearing pack). At the same time, a second limiting step 321 facing downstream is provided on an outer wall of the static bearing ring 32, and accordingly, a first limiting step 311 facing upstream is provided on an inner wall of the upper shell portion 31. Upon assembly, the first limiting step 311 can cooperate with the second position limiting step 321 to restrict the static bearing ring 32 axially. The above arrangement ensures that the static bearing ring 32 is able to press the screw or the outer ring of the turbine bearing pack tightly. The movable bearing ring 33 is fixedly connected to an outer wall of the upper end of the driving rod 34 by means of, e.g., interference fit, with its upper end face abutting against the screw or an inner ring of the turbine bearing pack, and its lower end face abutting against a positioning shoulder 341 of the driving rod 34. In this manner, the movable bearing ring 33 may function to axially press the screw or the inner ring of the turbine bearing pack. With the swivel bearing, the driving rod 34 and the upper shell portion 31 are prevented from wear. In addition, opposite to an axial lower end of the static bearing ring 32 there is provided with a supporting sleeve 42 (described in detail below), so that the static bearing ring 32 can function to abut against its upstream and downstream members, and transmit force as well.

Figure 1:
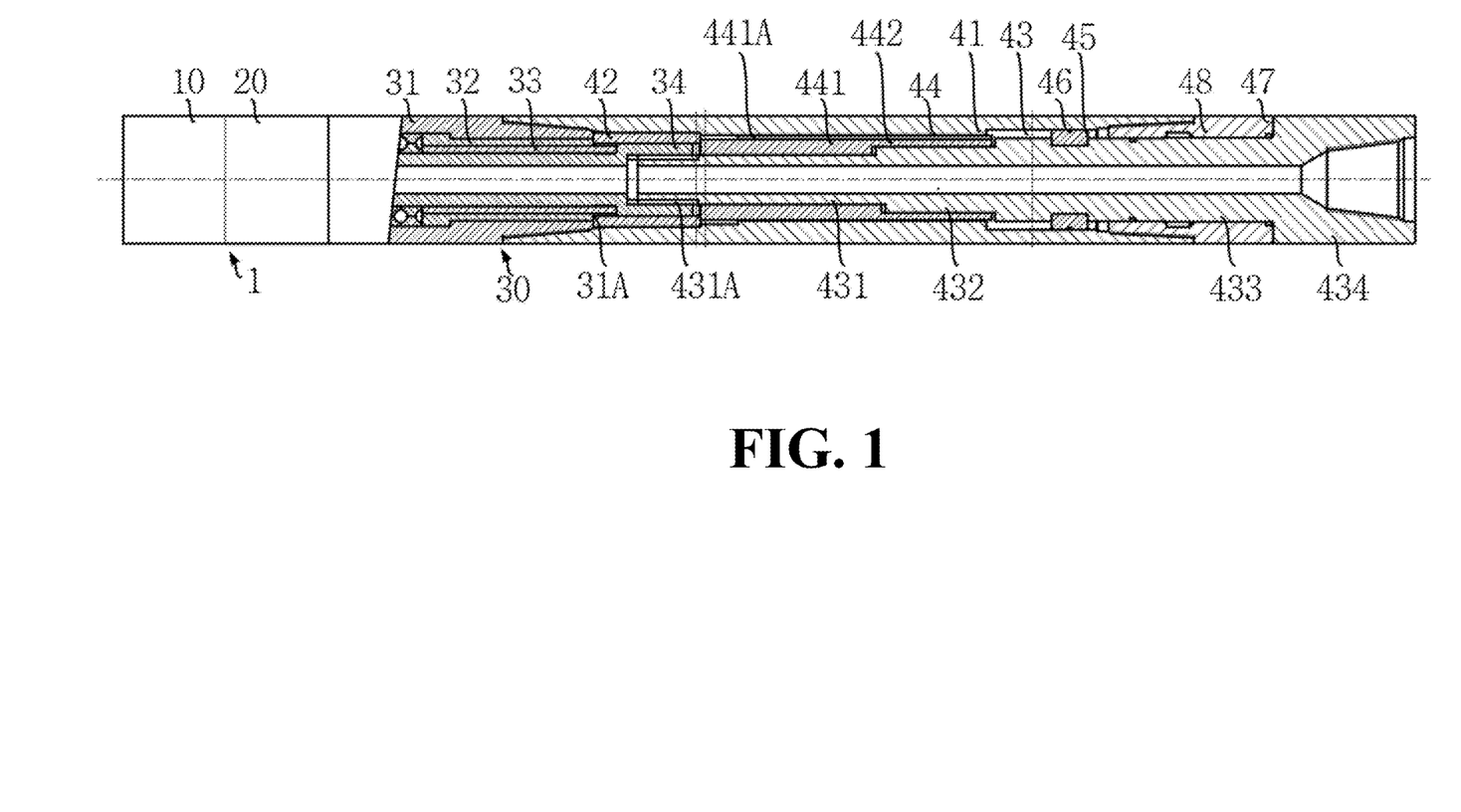
FIG. 1 schematically shows a drilling tool according to one embodiment of the present invention.

Downstream of the driving rod 34, a rotary working part is provided, which can be configured, for example, as a cylindrical rotary rod 43. At least a part of the rotary rod 43 is surrounded by the lower shell portion 41. As shown in FIG. 1, the rotary rod 43 includes, along a direction from upstream to downstream, a first rotating segment 431, a second rotating segment 432, a third rotating segment 433, and a fourth rotating segment 434. These rotating segments 431, 432, 433 and 434 each have a same inner diameter. An outer diameter of the first rotating segment 431 is smaller than that of the second rotating segment 432, which is, in turn, smaller than that of the third rotating segment 433, which is, in turn, smaller than that of the fourth rotating segment 434. An upstream end of the rotary rod 43 (i.e., the upstream end of the first rotating segment 431 as shown in FIG. 3) is inserted into the downstream end of the driving rod 34. A driving key 431A extending along the axial direction is formed on an outer wall of the first rotating segment 431, and a driving slot extending along the axial direction is formed on an inner wall of the driving rod 34. The driving slot is in engagement with the driving key 431A, so that when the driving key 431A is inserted into the driving slot, the rotary rod 43 is rotatable together with the driving rod 34, and movable relative to the driving rod 34 along the axial direction.

Figure 4:
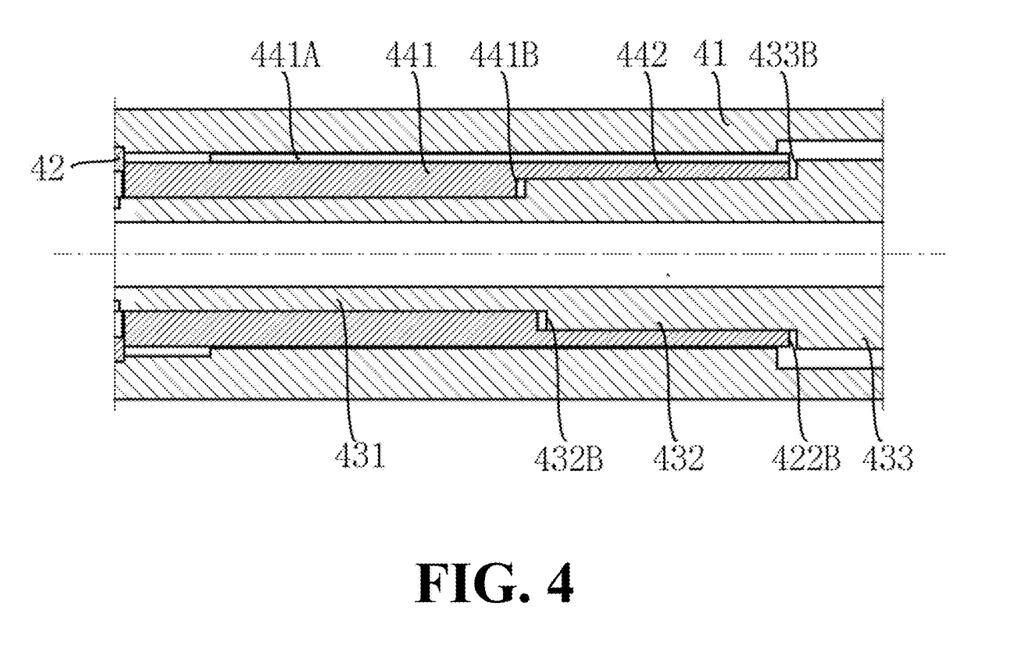
FIG. 4 schematically shows another portion of the drilling tool of FIG. 1.

The percussive device 30 further includes a percussive sleeve 44, which is arranged around at least a part of the rotary rod 43. As shown in FIGS. 1 and 4, the percussive sleeve 44 includes an upstream first sleeve segment 441, and a second sleeve segment 442 located downstream of the first sleeve segment 441 and connected therewith. The first sleeve segment 441 has an outer diameter the same as the second sleeve segment 442, but an inner diameter smaller than the second sleeve segment 422. Specifically, as shown in FIGS. 1 and 4, the first sleeve segment 441 of the percussive sleeve 44 is arranged around the first rotating segment 431 of the rotary rod 43, and the second sleeve segment 442 is arranged around the second rotating segment 432. The rotary rod 43 is rotatable relative to the percussive sleeve 44.

Figure 6:
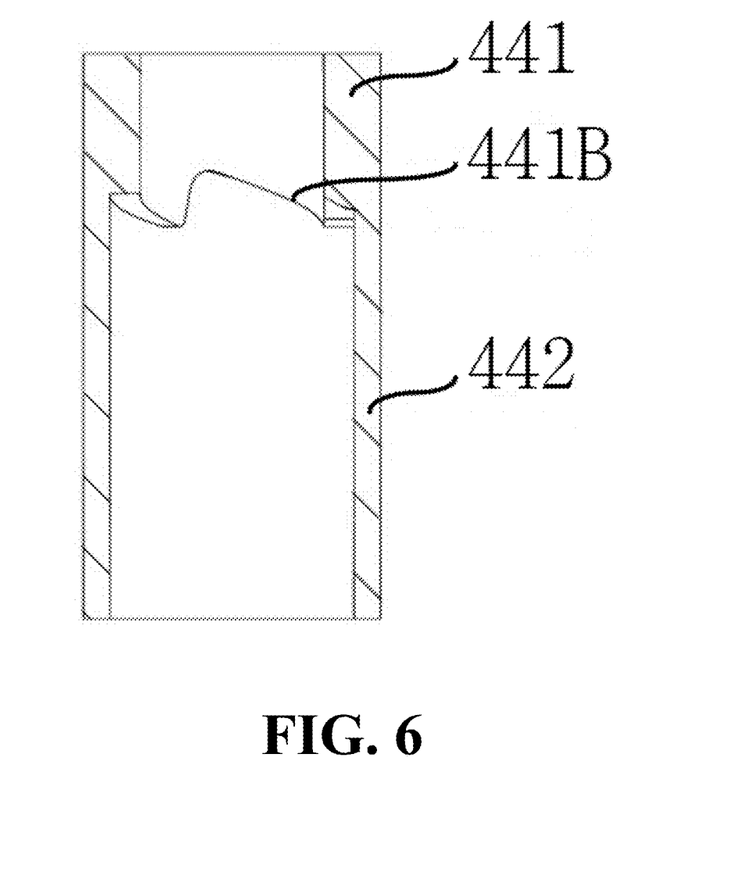
FIG. 6 schematically shows a partial view of a percussive sleeve of the drilling tool of FIG. 1.
Figure 7:
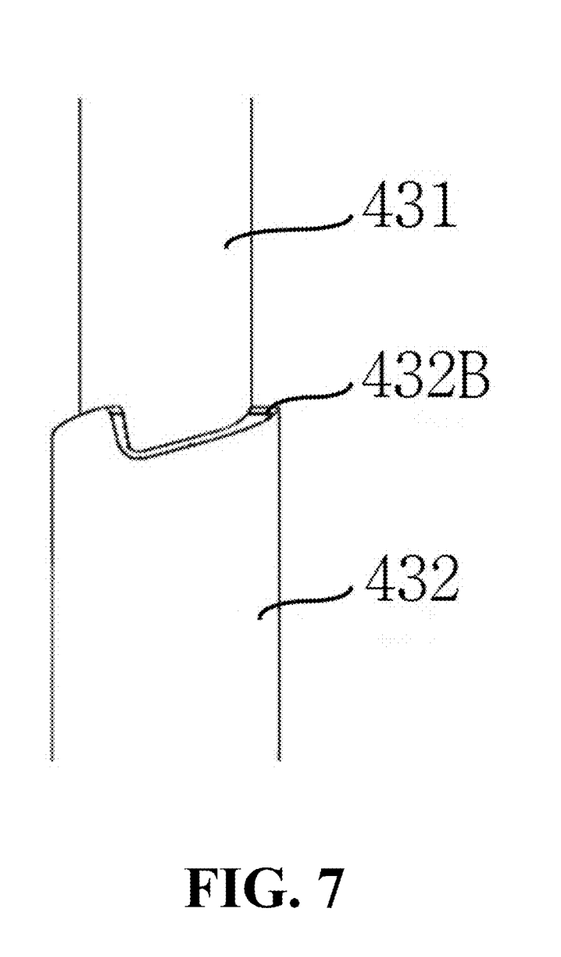
FIG. 7 schematically shows a partial view of a rotary rod of the drilling tool of FIG. 1.

As shown in FIG. 7, a lower driving tooth 432B having a tooth surface substantially facing upward is arranged at a connecting area between the first rotating segment 431 and the second rotating segment 432 of the rotary rod 43. Correspondingly, as shown in FIG. 6, an upper driven tooth 441B having a tooth surface substantially facing downward is arranged at a connecting area between the first sleeve segment 441 and the second sleeve segment 442. When the rotary rod 43 is arranged in the percussive sleeve 44, the upper driven tooth 441B and the lower driving tooth 432B are opposite to and in cooperation with each other. Each of the upper driven tooth 441B and the lower driving tooth 432B may be generally configured as having a wave-like shape as shown in FIGS. 6 and 7. As the rotary rod 43 rotates, in a first state, valleys of the upper driven tooth 441B are opposed to peaks of the lower driving tooth 432B. At this time, the rotary rod 43 will move upstream against the action of the percussive sleeve 44. As the rotary rod 43 continues to rotate, in a second state, peaks of the upper driven tooth 441B are opposed to peaks of the lower driving tooth 432B, while valleys of the upper driven tooth 441B are opposed to valleys of the lower driving tooth 432B. At this time, the percussive sleeve 44 moves downstream along the axial direction to impact the rotary rod 43. The downstream drilling bit as mentioned above is arranged at the downstream end of the rotary rod 43. Accordingly, the impact on the rotary rod 43 can be transmitted to the downstream drilling bit, so that the downstream drilling bit can impact the formation downwardly in rotary drilling.

In a preferred embodiment, the wave-shaped upper driven tooth 441B and the wave-shaped lower driving tooth 432B each include an upward tooth segment, and a downward tooth segment connected therewith. As shown in FIG. 7, the upward tooth segment of the lower driving tooth 432B are inclined upwardly along a direction opposite to a rotating direction of the rotary rod 43, while the downward tooth segment of the lower driving tooth 432B are inclined downwardly along the direction opposite to the rotating direction of the rotary rod 43. The inclination of the upward tooth segment is relatively gentle, while that of the downward tooth segment is relatively steep, so that the percussive sleeve 44 can have a greater speed when impacting on the rotary rod 43. That is, the percussive sleeve 44 can move upwardly relative to the rotary rod 43 at a relatively slow speed, but impact downwardly on the rotary rod 43 at a relatively fast speed.

As shown in FIG. 4, the lower shell portion 41 is arranged around the percussive sleeve 44. An orienting key 441A extending along the axial direction is formed on an outer wall of the percussive sleeve 44, and a corresponding orienting slot extending along the axial direction is formed on the inner wall of the lower shell portion 41. With the orienting key 441A being inserted into the orienting slot, the percussive sleeve 44 can be movable relative to the lower shell portion 41 along the axial direction, but not rotatable relative thereto. Therefore, the rotation of the percussive sleeve 44 can be effectively restricted, so that it can ensure that the percussive sleeve 44 does not rotate together with the rotary rod 43. That is, it can ensure the rotation of the rotary rod 43 relative to the percussive sleeve 44.

In a preferred embodiment, as shown in FIG. 4, a step surface 433B facing upstream is formed between the second rotating segment 432 and the third rotating segment 433 of the rotary rod 43. The lower end surface 442B of the percussive sleeve 44 faces the step surface 433B. The lower end surface 442B of the percussive sleeve 44 and the step surface 433B of the rotary rod 43 constitute a pair of impacting surfaces. When the lower end surface 442B of the percussive sleeve 44 is in contact with the step surface 433B of the rotary rod 43, a gap may exist between the lower driving tooth 432B and the upper driven tooth 441B. Thus, direct impact between the lower driving tooth 432B and the upper driven tooth 441B can be effectively avoided, thereby preventing damages thereof.

As shown in FIG. 3, the lower end of the upper shell portion 31 is inserted into the upper end of the lower shell portion 41. For example, said two portions may be connected with each other through drill pipe joint threads. The cylindrical supporting sleeve 42 is provided axially between the lower end surface 31A of the upper shell portion 31 and the step 41A in the lower shell portion 41. At the same time, the supporting sleeve 42 extends radially inward, so that an upper end surface of the supporting sleeve 42 is opposite to the lower end surface of the static bearing ring 32 while the lower end surface thereof is opposite to the upper end surface of the percussive sleeve 44. During tripping operations, the supporting sleeve 42 will fall on the step 41A in the lower shell portion 41 due to its own weight. When the bit pressure is applied so that the percussive sleeve 44 moves upwardly, the percussive sleeve 44 will press and push the supporting sleeve 42, the upper shell portion 31, and the cylindrical housing of the driving mechanism 20 to move upstream together, and thereby push up the drill rod 11 and the drill collar 12 of the upstream drilling string 10 so that they will suffer elastic compression along the axial direction. Later, when the upstream drilling string 10 including the drill rod 11 and the drill collar 12 releases the compression, the percussive sleeve 44 will be pushed to move downwardly to impact the rotary rod 43.

Figure 5:
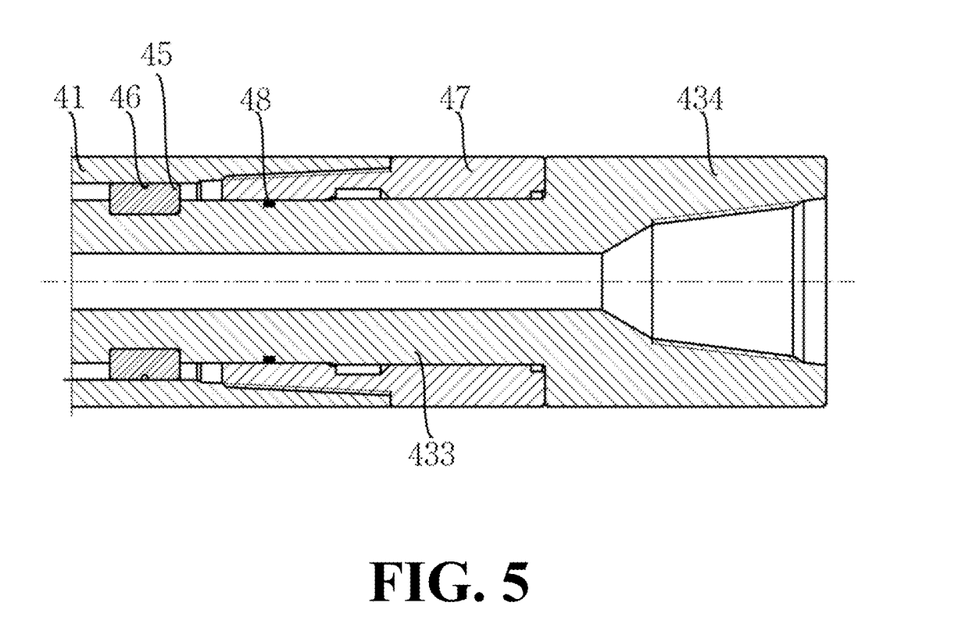
FIG. 5 schematically shows a further portion of the drilling tool of FIG. 1.

As shown in FIG. 5, a wear-resistant joint 47 is further connected to the lower end of the lower shell portion 41, for example, by means of threads. The wear-resistant joint 47 can improve the wear resistance between the lower shell portion 41 and the rotary rod 43, so as to improve the service life of the whole drilling tool 1. The wear-resistant joint 47 surrounds the third rotating segment 433 of the rotary rod 43, and a sliding seal 48 is arranged between the wear-resistant joint 47 and the third rotating segment 433. Accordingly, relative movement between the third rotating segment 433 and the wear-resistant joint 47 along the axial direction will occur in a sealed manner, thus preventing leakage of mud. The wear-resistant joint 47 is preferably made of alloy steel embedded with cemented carbide material, or metallurgical combination of alloy steel and S201 material, or metallurgical combination of alloy steel and DT30 material, so that it has sufficient wear resistance.

The fourth rotating segment 434 of the rotary rod 43 is located downstream of the wear-resistant joint 47. A step surface facing upstream is formed between the fourth rotating segment 434 and the third rotating segment 433. When the lower end surface 422B of the percussive sleeve 44 is in contact with the step surface 433B of the rotary rod 43, the step surface between the fourth rotating segment 434 and the third rotating segment 433 will be spaced apart from the downstream end surface of the wear-resistant joint 47.

In a preferred embodiment, as shown in FIG. 5, the third rotating segment 433 is formed on the outer wall thereof with a groove, in which a limiting block 45 protruding radially outward relative to the third rotating segment 433 is arranged. The limiting block 45 is sandwiched between the third rotating segment 433 and the lower shell portion 41 along the radial direction. An upper end of the wear-resistant joint 47 is inserted into the lower end of the lower shell portion 41. As a result, the upper end surface of the wear-resistant joint 47 faces the limiting block 45, so that axial movement range of the rotary rod 43 relative to the wear-resistant joint 47 can be restricted.

Preferably, the limiting block 45 can be configured as two semi-circular blocking shoes. After mounted, said two blocking shoes press tight the outer wall of the third rotating segment 433 at the groove, and are mounted on the outer wall of the third rotating segment 433, tightened using a wire 46. During tripping operations, the limiting block 45 along with the rotary rod 43 will be lowered relative to the lower shell portion 41, and then received on the wear-resistant joint 47, thus achieving anti-drop effect for the percussive sleeve 44, the rotary rod 43 and the limiting block 45.

The detailed working process of the above drilling tool 1 is as follows.

First, the above-described drilling tool 1 is lowered down to the well to be drilled. During this procedure, the rotary rod 43 moves downward relative to the driving rod 34 to a position where the limiting block 45 abuts against the upper end surface of the wear-resistant joint 47.

When the downstream drilling bit of the drilling tool 1 touches the bottom hole, the drilling tool 1 is continued to be lowered, so that the rotary rod 43 moves upward relative to the driving rod 34, until the upper end face of the percussive sleeve 44 abuts against the supporting sleeve 42.

Then, drilling operation starts. During operation, the downstream drilling bit acts on the formation. The rotary rod 43 and the downstream drilling bit rotate along with the driving rod 34. At the same time, the percussive sleeve 44 reciprocally moves up and down relative to the rotary rod 43. As the percussive sleeve 44 moves upward relative to the rotary rod 43, the drill rod 11 and the drill collar 12 of the upstream drilling string 10 will experience elastic compression. As the percussive sleeve 44 moves downward relative to the rotary rod 43, the elastic compression will be released, so that the percussive sleeve 44 will be pushed by the upstream drilling string 10 to move rapidly downward to impact on the rotary rod 43, thereby generating percussion of the downstream drilling bit toward the formation.

In order to design, manufacture and use the above drilling tool 1, a minimum WOB $P_1$ of the drilling tool 1 should be determined first, and then structural parameters and drilling parameters of the drilling tool are obtained based on the minimum WOB $P_1$.

In a first step, a minimum percussive power $W_0$ required for drilling is determined according to a compressive strength $P_r$ of the rock of the formation to be drilled.

In this step, rock of the formation to be drilled may firstly be sampled, and mechanical properties of the rock are analyzed for the sample taken. For example, lithology, drillability, hardness or the like of the sample can be determined here. The compressive strength $P_r$ of the rock can then be determined from the drillability and hardness of the rock, e.g., according to the table below.

TABLE 1

Relationship for hardness, drillability and compressive strength of the rock

| | Hardness, kg/mm² | | | | |
|---|---|---|---|---|---|
| | 10-50 | 50-100 | 100-150 | 150-200 | 200-300 |
| Grade of drillability | <2 | 2-3 | 3-4 | 4-5 | 5-6 |
| Compressive strength, MPa | <40 | 40-60 | 60-80 | 80-100 | 100-120 |
| | 300-400 | 400-500 | 500-600 | 600-700 | >700 |
| Grade of drillability | 6-7 | 7-8 | 8-9 | 9-10 | >10 |
| Compressive strength, MPa | 120-140 | 140-160 | 160-180 | 180-200 | >200 |

In addition, percussive crushing experiments at different compressive strengths can be performed for the rock of the formation to be drilled. According to the experimental results, the relationship between the percussive power $W_0$ required for breaking the rock and the compressive strength of the rock is determined. For example, a regression curve of the relationship between the percussive power $W_0$ required for breaking the rock and the compressive strength of the rock can be established. Therefore, after the compressive strength of the rock of the formation is determined, the value of the minimum percussive power $W_0$ required for breaking the rock can be determined based on the above-mentioned relationship curve.

For example, for mudstone, $W_0=0.0034P_r^2+0.325P_r+129.91$; for sandstone, $W_0=0.0067P_r^2+0.2196P_r+35.571$; and for limestone, $W_0=0.0081P_r^2-0.1702 P_r+45.464$.

In a second step, according to the value of the minimum percussive power $W_0$ required for breaking the rock, the value of a preset percussive power W for the drilling operation can be determined. The value of the preset percussive power W may be substantially equal to that of the minimum percussive power $W_0$, or alternatively, greater than that of the minimum percussive power $W_0$ if required.

In a third step, the minimum WOB $P_1$ required for drilling is calculated according to the determined value of the preset percussive power W. The minimum WOB $P_1$ required for drilling is the pressure exerted on the drilling tool 1 by an operator on ground during well drilling.

For example, the minimum WOB $P_1$ can be calculated by the following formula:

$$W = hP_1 + \frac{1}{2}h\frac{h}{\frac{L_p}{A_pE_p} + \frac{L_c}{A_cE_c}}$$

wherein $P_1$ is the minimum WOB required for drilling, W is the preset percussive power, h is the stroke of the percussive device, $L_p$ is the length of the drill pipe, $A_p$ is the cross-sectional area of the drill pipe, $E_p$ is the elastic modulus of the drill pipe, $L_c$ is the length of the drill collar, $A_c$ is the cross-sectional area of the drill collar, and $E_c$ is the elastic modulus of the drill collar.

The above parameters, such as the stroke h, the length $L_p$ of the drill pipe, the cross-sectional area $A_p$ of the drill pipe, the elastic modulus $E_p$ of the drill pipe, the length Le of the drill collar, the cross-sectional area $A_c$ of the drill collar, the elastic modulus $E_c$ of the drill collar or the like, can each be preset to a value. If the value of the minimum WOB $P_1$ does not meet the actual drilling requirements, at least one of the above-mentioned parameters can be re-determined and re-calculated, until the minimum WOB $P_1$ as calculated is within the applicable range of drilling.

In a fourth step, in the method for designing and manufacturing the drilling tool 1, after the above-mentioned minimum WOB $P_1$ is obtained by calculation, a torque value required for operations of the power source (e.g., the screw motor and the turbodrill) and the driving rod 34 can be determined according to the minimum WOB $P_1$, and based on which, the type of the power source and the parameters of the driving rod 34 can be determined. Accordingly, all drilling parameters can be selected and determined based on a design manual for the power source. For example, the drilling parameters may include WOB, displacement, rotational speed, or the like.

In a fifth step, key structural parameters of core members of the tool, i.e., the rotary rod 43 and the percussive sleeve 44, are determined according to the minimum WOB $P_1$ and the stroke h. For example, the key structural parameters may include tooth number and tooth height of each of the lower driving tooth and the upper driven tooth.

As an alternative, according to the needs of the drilling site, the value of the minimum WOB $P_1$ can also be preset, and the value of the preset percussive power W can be determined according to the preset value of the minimum WOB $P_1$. Then, the value of the preset percussive power W is compared with that of the minimum percussive power $W_0$. If the value of the preset percussive power W is substantially greater than or equal to that of the minimum percussive power $W_0$, the preset value of the minimum WOB $P_1$ can be used in subsequent operations. Otherwise, the value of the minimum WOB $P_1$ and/or the value of at least one of the above parameters should be re-preset, and calculation is performed again, until the value of the preset percussive power W is substantially greater than or equal to that of the minimum percussive power $W_0$.

The drilling tool 1 described above is particularly suitable for vertical well drilling in hard formation environments with a depth exceeding several thousand meters. The length of the drill pipe is at least ten times the stroke h. Assuming that the lower part of the drilling string is a 200 m drill collar, when the well depth is greater than 200 m plus 10 times the length of the stroke (h), the drill pipe has a relatively small rigidity, and can be considered as an elastic drilling string. At this time, the deformation is mainly caused by the drill pipe.

For example, thrust augment required for achieving a certain stroke (for example, 10 mm) will decrease rapidly with the increase of the drill pipe. The calculation results show that as long as a 100 m drill pipe is connected, the required thrust augment will decrease rapidly from 17.92 t to 4.38 t, and then gradually approach 0.

The drilling tool 1 according to the present invention is based on composite dual-drive and elastic energy storage of the upstream drilling string 10. In operation, the upstream drilling string 10 can be compressed and recovered, and during the downward recovering procedure, potential energy will drive the downstream drilling bit to impact the formation reciprocally, generating a comprehensive effect of high-speed rotation and high-frequency percussion. Therefore, the drilling tool 1 according to the present invention has the advantages of high rock-breaking frequency, strength and efficiency, achieving an improved speed-enhancing effect. The upstream drilling string 10 can provide much greater elastic compression than elastic members commonly used in the field (e.g., helical springs, disc springs, etc.). Accordingly, the downstream drilling bit is allowed to generate percussion of relatively high frequency and magnitude, which is more beneficial to improve the drilling speed and drilling efficiency of the drilling tool 1.

In addition, the above drilling tool 1 does not have any weak part in structure, which is beneficial to improve the structural stability of the drilling tool 1 and prolong the service life of the drilling tool 1.

Although the present invention has been described with reference to the preferred embodiments, various modifications may be made and equivalents may be substituted for components thereof without departing from the scope of the present invention. In particular, under the condition that there is no structural conflict, each technical feature mentioned in each embodiment can be combined in any manner. The present invention is not limited to the specific embodiments disclosed herein, but includes all technical solutions falling within the scope of the claims.

The invention claimed is:

1. A drilling tool, comprising:
an upstream drilling string;
a downstream drilling bit; and
a percussive device connected between the upstream drilling string and the downstream drilling bit,
wherein in a first state, an elastic compression force is generated within the upstream drilling string by the percussive device, and
in a second state, the upstream drilling string releases the elastic compression to apply impacts on the downstream drilling bit through the percussive device,
wherein the percussive device comprises:
a rotary driving part configured to be rotatable about its axis;
a rotary working part, which has an upper end in engagement with a lower end of the rotary driving part and a lower end connected with the downstream drilling bit, wherein the rotary working part is configured to be driven by the rotary driving part to rotate about its axis, and axially movable relative to the rotary driving part; and
a percussion generating part arranged around the rotary working part, the percussion generating part having an upper end abutting against the upstream drilling string and a lower end abutting against the rotary working part,
wherein in the first state, the percussion generating part moves upstream so that the upstream drilling string is generated with the elastic compression, and
in the second state, the upstream drilling string releases the elastic compression, so that the percussion generating part moves downstream to apply impact on the rotary working part,
wherein the rotary driving part comprises a cylindrical driving rod, which has an upper end coupled with a power source, and
the rotary working part comprises a cylindrical rotary rod, which has an upper end in engagement with a lower end of the driving rod through a driving key, and a lower end connected with the downstream drilling bit,
wherein the upper end of the rotary rod is inserted into the lower end of the driving rod and provided at an outer side thereof with the driving key extending along an axial direction of the rotary rod, and the lower end of the driving rod is provided at an inner side thereof with a driving slot extending along an axial direction of the driving rod, wherein the driving key is fitted in the driving slot, so that the rotary rod is fixed relative to the driving rod along a circumferential direction, and movable relative thereto along the axial direction,
wherein the percussion generating part comprises a percussive sleeve, which is arranged around the rotary rod, and has a first sleeve segment with a relatively small inner diameter and a second sleeve segment with a relatively large inner diameter, the second sleeve segment being arranged below and connected with the first sleeve segment, wherein an upper driven tooth is formed at an inner side of the percussive sleeve in an area connecting the first sleeve segment with the second sleeve segment,
the rotary rod includes a first rotating segment with a relatively small outer diameter and a second rotating segment with a relatively large outer diameter, the second rotating segment being arranged below and connected with the first rotating segment, wherein a lower driving tooth is formed on an outer side of the rotary rod in an area connecting the first rotating segment with the second rotating segment, and
the lower driving tooth and the upper driven tooth are configured to be in cooperation with each other, so that when the rotary rod rotates relative to the percussive sleeve, the percussive sleeve reciprocates axially relative to the rotary rod under the cooperation between the lower driving tooth and the upper driven tooth.

2. The drilling tool according to claim 1, wherein the upper driven tooth and the lower driving tooth are each configured with an upward tooth segment inclined upstream in a direction opposite to a rotating direction, and a downward tooth segment inclined downstream in the direction opposite to the rotating direction, wherein an inclination of the upward tooth segment is smaller than that of the downward tooth segment.

3. The drilling tool according to claim 1, wherein the rotary rod further comprises a third rotating segment, which is connected to a lower end of the second rotating segment and has an outer diameter larger than that of the second rotating segment, and a percussive step facing upstream is formed between the second rotating segment and the third rotating segment, so that the lower end of the percussive sleeve is opposite to and able to impact on the percussive step, and an axial gap is formed between the upper driven tooth and the lower driving tooth when the lower end of the percussive sleeve is in contact with the percussive step.

4. The drilling tool according to claim 3, wherein the third rotating segment of the rotary rod is formed on a side wall thereof with a groove, in which a limiting block protruding radially outward relative to the third rotating segment is arranged; and a cylindrical outer shell is arranged around the percussive sleeve and extends downward to surround the third rotating segment, and has an engaging portion extending radially inwardly at a lower end of the outer shell, wherein the limiting block is located upstream of the engaging portion, and configured to be able to abut against the engaging portion to restrict a downstream movement of the rotary rod relative to the outer shell.

5. The drilling tool according to claim 1, wherein a cylindrical outer shell is arranged around the percussive sleeve, the outer shell being slidably engaged with the percussive sleeve through an orienting key, and having an upper end connected with the upstream drilling string, and wherein the percussive sleeve is provided at an outer side thereof with the orienting key extending axially, and the outer shell is provided at an inner side thereof with an orienting slot extending axially, the orienting key being fitted in the orienting slot so that the percussive sleeve is fixed relative to the outer shell in the circumferential direction, and movable relative thereto in the axial direction.

6. The drilling tool according to claim 5, wherein the outer shell includes an upper shell portion connected to the upstream drilling string, and a lower shell portion located below and connected with the upper shell portion, at least a part of the driving rod being disposed within the upper shell portion, wherein a swivel bearing is provided between the upper shell portion and the driving rod to allow rotation of the driving rod relative to the upper shell portion;

the lower shell portion surrounds the percussive sleeve; and a lower end of the upper shell portion is inserted into an upper end of the lower shell portion, and a supporting sleeve is provided between the lower end of the upper shell portion and the upper end of the percussive sleeve, so that the percussive sleeve exerts a force on the upper shell portion through the supporting sleeve, thereby elastically compressing the upstream drilling string.

7. A method for determining parameters of the drilling tool of claim 1, comprising:

determining a value of a minimum percussive power required for drilling based on a compressive strength of rock of a formation to be drilled;

determining a value of a preset percussive power based on the determined value of the minimum percussive power, wherein the value of the preset percussive power is not lower than that of the minimum percussive power;

determining a minimum WOB required for drilling based on the value of the preset percussive power, and determining a torque value required for operations of the power source and the driving rod based on the minimum WOB required for drilling, and then determining a type of the power source and parameters of the driving rod, and then selecting and determining drilling parameters, wherein the drilling parameters include WOB, displacement or rotational speed, and/or determining structural parameters of the rotary rod and the percussive sleeve of the drilling tool based on the minimum WOB required for drilling, wherein the structural parameters include tooth number and tooth height of each of the lower driving tooth and the upper driven tooth.

8. The method according to claim 7, wherein in the drilling tool, the rotary driving part comprises a cylindrical driving rod, which has an upper end coupled with a power source, and the rotary working part comprises a cylindrical rotary rod, which has an upper end in engagement with a lower end of the driving rod through a driving key, and a lower end connected with the downstream drilling bit, wherein the upper end of the rotary rod is inserted into the lower end of the driving rod and provided at an outer side thereof with the driving key extending along an axial direction of the rotary rod, and the lower end of the driving rod is provided at an inner side thereof with a driving slot extending along an axial direction of the driving rod, wherein the driving key is fitted in the driving slot, so that the rotary rod is fixed relative to the driving rod along a circumferential direction, and movable relative thereto along the axial direction.

9. The method according to claim 8, wherein in the drilling tool, the percussion generating part comprises a percussive sleeve, which is arranged around the rotary rod, and has a first sleeve segment with a relatively small inner diameter and a second sleeve segment with a relatively large inner diameter, the second sleeve segment being arranged below and connected with the first sleeve segment, wherein an upper driven tooth is formed at an inner side of the percussive sleeve in an area connecting the first sleeve segment with the second sleeve segment;

the rotary rod includes a first rotating segment with a relatively small outer diameter and a second rotating segment with a relatively large outer diameter, the second rotating segment being arranged below and connected with the first rotating segment, wherein a lower driving tooth is formed on an outer side of the rotary rod in an area connecting the first rotating segment with the second rotating segment; and the lower driving tooth and the upper driven tooth are configured to be in cooperation with each other, so that when the rotary rod rotates relative to the percussive sleeve, the percussive sleeve reciprocates axially relative to the rotary rod under the cooperation between the lower driving tooth and the upper driven tooth.

10. The method according to claim 9, wherein in the drilling tool, the upper driven tooth and the lower driving tooth are each configured with an upward tooth segment inclined upstream in a direction opposite to a rotating direction, and a downward tooth segment inclined downstream in the direction opposite to the rotating direction, wherein an inclination of the upward tooth segment is smaller than that of the downward tooth segment.

11. The method according to claim 9, wherein in the drilling tool, the rotary rod further comprises a third rotating segment, which is connected to a lower end of the second rotating segment and has an outer diameter larger than that of the second rotating segment, and a percussive step facing upstream is formed between the second rotating segment and the third rotating segment, so that the lower end of the percussive sleeve is opposite to and able to impact on the percussive step, and an axial gap is formed between the upper driven tooth and the lower driving tooth when the lower end of the percussive sleeve is in contact with the percussive step.

12. The method according to claim 11, wherein in the drilling tool, the third rotating segment of the rotary rod is formed on a side wall thereof with a groove, in which a limiting block protruding radially outward relative to the third rotating segment is arranged; and a cylindrical outer shell is arranged around the percussive sleeve and extends downward to surround the third rotating segment, and has an engaging portion extending radially inwardly at a lower end of the outer shell, wherein the limiting block is located upstream of the engaging portion, and configured to be able to abut against the engaging portion to restrict a downstream movement of the rotary rod relative to the outer shell.

13. The method according to claim 9, wherein in the drilling tool, a cylindrical outer shell is arranged around the percussive sleeve, the outer shell being slidably engaged with the percussive sleeve through an orienting key, and having an upper end connected with the upstream drilling string, and wherein the percussive sleeve is provided at an outer side thereof with the orienting key extending axially, and the outer shell is provided at an inner side thereof with an orienting slot extending axially, the orienting key being fitted in the orienting slot so that the percussive sleeve is fixed relative to the outer shell in the circumferential direction, and movable relative thereto in the axial direction.

14. The method according to claim 13, wherein in the drilling tool, the outer shell includes an upper shell portion connected to the upstream drilling string, and a lower shell portion located below and connected with the upper shell portion, at least a part of the driving rod being disposed within the upper shell portion, wherein a swivel bearing is provided between the upper shell portion and the driving rod to allow rotation of the driving rod relative to the upper shell portion;

the lower shell portion surrounds the percussive sleeve; and a lower end of the upper shell portion is inserted into an upper end of the lower shell portion, and a supporting sleeve is provided between the lower end of the upper shell portion and the upper end of the percussive sleeve, so that the percussive sleeve exerts a force on the upper shell portion through the supporting sleeve, thereby elastically compressing the upstream drilling string.

\* \* \* \* \*